(12) United States Patent
Kapourchali et al.

(10) Patent No.: US 7,279,078 B2
(45) Date of Patent: Oct. 9, 2007

(54) THIN-FILM COATING FOR WHEEL RIMS

(76) Inventors: Micha Kapourchali, 520 Kingsley Rd., Vienna, VA (US) 22180; Nima Khalilian, 3216 Cobb Hill La., Oakton, VA (US) 22124

( * ) Notice: Subject to any disclaimer, the term of this patent is extended or adjusted under 35 U.S.C. 154(b) by 0 days.

(21) Appl. No.: 11/113,683

(22) Filed: Apr. 25, 2005

(65) Prior Publication Data

US 2005/0258028 A1  Nov. 24, 2005

Related U.S. Application Data

(60) Provisional application No. 60/564,690, filed on Apr. 23, 2004.

(51) Int. Cl.
   *C23C 14/34*   (2006.01)
   *C23C 16/00*   (2006.01)
(52) U.S. Cl. ............ 204/192.12; 204/192.15; 204/192.38; 427/448; 427/452; 427/455; 427/585; 427/587; 427/248.1; 427/250; 427/256; 427/287; 301/95.101; 301/95.103; 29/894.35
(58) Field of Classification Search ........... 204/192.12, 204/192.15, 192.38; 427/446, 448, 452, 427/453, 585, 587, 248.1, 250, 455; 301/95.101, 301/95.103; 29/894.35
See application file for complete search history.

(56) References Cited

U.S. PATENT DOCUMENTS

| | | | | |
|---|---|---|---|---|
| 5,056,630 A | * | 10/1991 | Fujii et al. | 188/24.13 |
| 5,211,991 A | * | 5/1993 | Bullock | 427/448 |
| 5,332,601 A | * | 7/1994 | Varacalle et al. | 427/452 |
| 6,159,011 A | | 12/2000 | Moormann et al. | |
| 6,254,458 B1 | | 7/2001 | Julien | |
| 6,399,152 B1 | * | 6/2002 | Goodrich | 427/250 |
| 2004/0034999 A1 | * | 2/2004 | Blaser, Jr. | 29/894.3 |

* cited by examiner

*Primary Examiner*—Rodney G. McDonald
(74) *Attorney, Agent, or Firm*—Roberts Mardula & Wertheim, LLC

(57) ABSTRACT

A process for coating a non-uniform, thin-film, dichroic pattern to a wheel rim or motorcycle part. The thin-film coating adds a colored or iridescent pattern to the wheel rim or motorcycle part, while maintaining other characteristics, such as brilliance, shine, durability and general appearance. The coating is intentionally non-uniform. It may be varied, and may have different patterns and color among different articles, and even among different areas on the same article. The thin-film coating may be added by various techniques known in the art, but is preferably applied by sputtering a silicon or titanium target to obtain the thin-film on a chromed wheel rim.

18 Claims, No Drawings

THIN-FILM COATING FOR WHEEL RIMS

This application claims the benefit of Provisional Application No. 60/564,690 filed Apr. 23, 2004. The entire Provisional Application No. 60/564,690 is incorporated herein by reference.

BACKGROUND OF THE INVENTION

The present invention is generally drawn to a method of depositing a thin-film color coating on wheel rims and motorcycle parts using ion bombardment, as well as the wheel rims and motorcycle parts products formed by the method. More particularly, a preferred embodiment of the invention is drawn to depositing a non-uniform thin-film color or dichroic coating to chrome wheel rims by sputtering with a silicon or titanium target, and the wheel rims formed by the method.

Wheel rims and motorcycle parts are aesthetically an important part of the vehicle.

With respect to wheel rims, billions of dollars are spent world-wide each year in the production of new rims to add style and luxury to the automotive industry.

Common among the varied shapes and patterns used, is the desire to have the rims be as brilliant and polished as possible. Techniques in the industry have focused on plating the rims, typically with a surface chromium composition, though other materials have also been used.

Variations on the metallic plating, however, are difficult to produce. The rims are subject to disfiguring environmental conditions. Paints, for example, wear quickly and do not produce the expected brilliance of a chrome plating. Other types of coatings are also prone to wear, and if their appearance is too varied from the industry standards they will inhibit, rather than enhance, the value of the vehicle.

What is needed are wheel rims and motorcycle parts that provides an alternate appearance to the chrome plating, while maintaining functional viability.

U.S. Pat. No. 5,056,630 FUJII relates to a wheel rim for a two-wheeled vehicle and has a spray coated layer formed from a metal alloy or ceramic covering at least a part of a rim surface with a brake shoe brought into contact which coating provides improved friction characteristics.

U.S. Pat. No. 6,159,011 MOORMANN is a process for producing a bonded titanium-ceramic composite system, which involves ion implanting. The ion implantation forms a surface layer with excellent adhesion to the ceramic surface.

U.S. Pat. No. 6,254,458 JULIEN is a process for producing a surface layer material having nitinol (nickel-titanium alloy) chemical and galvanic corrosion and resistant to chipping, erosion and abrasion.

U.S. Pat. No. 6,399,152 GOODRICH relates to vapor deposition of nickel-chromium and chromium metallic layer that permits a decorative chrome coating to be applied to a metal object.

BRIEF SUMMARY OF THE INVENTION

The present invention relates to coating a thin-film pattern to wheel rims and motorcycle parts. The coating is intentionally non-uniform and is applied by physical vapor deposition (PVD). The coating is preferably dichroic and adds a colored, iridescent pattern to the wheel rim, while maintaining other characteristics, such as brilliance, shine, durability, and general appearance.

The coating may be varied from rim to rim, and may have different patterns and colors among different rims, and even among different areas on the same rim. The thin-film coating may be added by various techniques known in the art. The general outcome of the appearance of the rims may be varied by modifying these techniques.

The coating typically added to chrome plating; however, they may be added to other surfaces as desired.

DETAILED DESCRIPTION OF THE INVENTION

The present invention provides for a wheel rim or motorcycle parts that has coated thereon a thin-film deposition. The application of the thin-film deposition may be done by a variety of techniques, including but not limited to sputtering, cathodic arc, magnetron sputtering, thermal evaporation, and other physical vapor deposition methods. The coating adds a colored pattern to the rim, while maintaining other desired characteristics, such as brilliance, shine, iridescence, durability and general appearance. Variations in the chemical composition of the coating may be used to alter the coloring and other characteristics of the deposition. Other techniques, such as varying the pressure and temperature used in the process, may also produce desired variations in the thin-film deposition.

The coating may be varied from rim to rim, and may have different patterns and color among different rims, and even among different areas on the same rim based upon intentional non-uniformity of the thin-film coating. Generally, an iridescent "rainbow" effect is produced on the rim, while maintaining the underlying brilliance and shine of the original plating. The rainbow effect may favor certain colors over others, producing a limited or skewed spectrum. The coatings are typically added to chrome plating; however, they may be added to other substrates as desired.

In one embodiment, the thin-film deposition may add increased durability to the rim. This durability makes the rim easier to maintain, and provides a resistance to the elements.

The coating may be a variety of different types suitable for thin-film deposition. In one embodiment, a substantially pure silicon or pure titanium target, both doped and undoped, is used. Other materials that may be used in conjunction with silicon and titanium include, but are not limited to, aluminum, boron, carbon, chromium, cobalt, copper, gold, iridium, iron, lead, magnesium, manganese, molybdenum, nickel, niobium, platinum, silver, tantalum, tin, tungsten, vanadium, zinc, zirconium and oxides thereof.

Sputter coating is a PVD process where atoms of a solid target are ejected by the bombardment of energetic ions onto the target. The collection of these sputtered atoms on a nearby object, called a substrate, coats the substrate with the target material. The source of the bombarding ions is commonly a gas discharge, where collisions between electrons and neutral gas atoms results in the generation of electron and gas ion pairs, the ions having a positive charge. A negatively charged electrode (cathode) placed in the gas discharge attracts the positive ions causing the ion bombardment responsible for sputtering.

The target is consumed by the sputtering process and requires periodic replacement. A cathode assembly supports the target, provides water cooling, sets up a magnetic field in the region of the gas discharge and shields non-target portions of the cathode from unwanted ion bombardment. Most sputtering systems operate with the target at a negative potential, with a grounded metal chamber acting as an anode. The gas discharge is usually made from argon gas at pressures in the range of 1 to 20 millitorr. (Atmospheric pressure is 760 Torr.)

Argon is the gas of choice because of its chemical inertness, relatively large atomic mass, and relatively low cost. Electrical gas discharges can be achieved with any gas, but if a chemically reactive gas is chosen, it will react with atoms sputtered from the target to yield a coating, which is the reaction product of the two constituents. When this is intentionally done, the process is termed reactive sputtering. An example of reactive sputtering is the sputtering of a titanium target in a nitrogen-argon gas mixture to yield a coating of titanium nitride. Residual atmospheric gas contaminants present in the gas discharge will also react with the coating material resulting in its contamination. Since this is to be avoided, many sputtering systems are evacuated in the region of the discharge to pressure levels of $1\times10^{-7}$ Torr or less prior to introduction of the ion providing gas.

Another method of minimizing coating contamination is achieved by increasing the coating rate. This method is effective because at a given constant residual gas pressure, the degree of coating purity is directly proportional to coating rate. Thus, a doubling of the coating rate has the same effect as having the residual gas pressure.

Many sputter coating applications require that the temperature of the substrate be regulated to achieve optimum coating quality. The substrate support is accordingly provided with a heating and/or cooling means. Similarly, coating quality can also be improved if the substrate is subjected to a moderate negative bias with regard to the gas discharge. This method, termed bias sputtering, causes positive argon ion bombardment of the coating during its growth, which bombardment can have beneficial effects of coating porosity, stress and uniformity.

Another method is known as rapid rate reactive sputtering of titanium and like metallic compounds onto a substrate or work piece. This method comprises substrate coating by cathodic magnetron sputtering and includes a substrate to be coated, a coating material mounted on a target plate, electrode plates causing gas plasma particles to strike the target to release the coating material, means to control the rate of deposition of the coating material, and means to carry the article to be coated and to expose the desired portions for coating.

Other methods for coating substrates with thin metallic films have been accomplished by vapor deposition and plasma spray processes. Vapor deposition processes to provide a metallic thin-film on a work piece utilize the material to be plated which is heated in a suitable atmosphere, such as in a vacuum or an inert shielding gas, to such an extent that the material evaporates and is deposited as a film on a substrate. Plasma spray processes provide the material to be deposited as a fine-grained powder which is brought into a plasma arc so that the particles melt and are deposited on a substrate. In other embodiments, instead of magnetron sputtering cathode, a thermal evaporation, Electron Bombardment Evaporation (E Beam evaporation), and/or cathodic arc may also be used.

Therefore, the sputtering is a vacuum used to deposit very thin films is accomplished by putting a high voltage across a low-pressure gas, such as argon, to create a plasma, which is an electrically neutral, highly ionized gas composed of ions, electrons, and neutral particles. Plasma is a phase of matter distinct from solids, liquids, and normal gases. Since the plasma emits a colorful halo of light, it is also sometimes called a "glow discharge" process. During sputtering, energized plasma composed of the desired coating material ions strike the target and cause atoms from that target to be ejected with enough energy to travel to, and bond with, the substrate.

Particular embodiments of methods for producing a thin-film deposition on a wheel rim are described in the following examples:

EXAMPLE 1

A chrome plated rim is cleaned in an acetone solution. A 99.995% pure silicone or titanium target is sputtered onto the rim. The sputtering cathode used is a six-inch diameter magnetron sputtering cathode. A vacuum is applied around the rim to remove air and other impurities. The pressure created is between $1\times10^{-6}$ to $1\times10^{-1}$ Torr, and particularly about $1\times10^{-5}$ Torr. The sputtering uses an inert gas, though the inert gas may also be combined with a reactive gas such as oxygen, nitrogen, or cetalyne, or a combination of such gases to achieve desired results. The gas is used to generate an ionizing plasma that is responsible for sputtering the target material away and then depositing the material on the rim. The sputtering is controlled by a voltage, and this may be altered to produce differences in the deposition of the silicon. Also, varying the pressure will also produce similar differences.

EXAMPLE 2

In one embodiment, the energy supply used may be a DC voltage source that can range from 308-1008 volts or 30-283 watts. Once a vacuum is accomplished, the target is activated by an electrical charge and the system begins sputtering the silicon or titanium onto the substrate (rim). The coating material is being transformed into a gaseous or vapor state, then the vapor is transferred through the rarefied pressure region also known as the vacuum that exist between the silicon source and the substrate. The vapor then condenses onto the substrate surface and forms a thin layer.

In this embodiment the inside temperature is negligible depending on heat generated by the deposition itself. This sputtering can go on anywhere from 5 to 40 minutes, depending on the color iridescence desired. A typical deposition is from 300 to 3000 Angstroms on the rim surface. Once the process is complete the target is deactivated and the chamber is depressurized and opened. This film will not easily wipe off, nor will it come off employing the tape test, where a piece of adhesive tape is placed on the substrate and then peeled off. In one embodiment, the sputtering is accomplished with the target at a 90° angle with the deposition. This increases the control over the thickness of the deposition.

An example of sputtering equipment would comprise a vacuum system, a power supply, equipment to introduce the sputtering gas, and a sputtering gun. The vacuum system itself comprises a pumping system, a chamber, and metrology to measure the vacuum levels and sputtering gas levels. The pumping system is usually a combination of a roughing/backing pump and a high vacuum pump. The roughing/backing pump can evacuate the chamber to about $\frac{1}{3000}^{th}$ of an atmosphere.

In addition to sputtering, other types of thin-film deposition include, but are not limited to, evaporation and chemical vapor deposition (CVD).

While ion deposition processes are concerned with uniformity of the film and conductivity for precise manufacturing processes, the process of the present invention is directed to control of color and iridescence on the wheel outer surface. This provides control over the aesthetic effects rather than conductivity or uniformity.

Additionally, the deposition of the thin-film for aesthetic enhancement also provides additional protection to the wheels, such as corrosion protection.

Though the present invention may be used on a variety of rim surfaces, a particular embodiment is to have the thin-film deposition on a chrome plating. One method of applying a chrome plating is to first buff the rim alloy, then apply a zincate. Onto this is applied a heavy copper plating, which is then buffed and cleaned. Next is applied a bright nickel plating, and then a hexavalent chrome plating. This is then rinsed and dried.

Chrome or other bright substrates useful with the present invention are sometimes applied to plastic articles. When the substrate or a portion thereof is applied over plastic, the sputtering or other thin-film coating process should be carried out without heating of the substrate so as to avoid damage to the plastic.

In one embodiment, the invention is a method of forming a thin-film coating on wheel rims and motorcycle parts, comprising: preparing a surface of the wheel rim or motorcycle part; positioning the wheel rim or motorcycle part in a treatment chamber; and applying a non-uniform thin-film coating to the surface of the wheel rim or motorcycle part selected from the group consisting of silicon and titanium. This method included many variations including those wherein the surface is pretreated with acetone, the surface is pretreated with rouge (ferric oxide). Some methods for applying the thin-film coating include sputtering, bias sputtering, cathodic magnetron sputtering, vapor deposition, plasma spray, chemical vapor deposition, thermal evaporation deposition, E Beam evaporation, and cathodic arc deposition. Further, the thin-film coating can consist essentially of doped silicon, undoped silicon, doped titanium, or undoped titanium, wherein doping substances are selected from the group consisting of aluminum, boron, carbon, chromium, cobalt, copper, gold, iridium, iron, lead, magnesium, manganese, molybdenum, nickel, niobium, platinum, silver, tantalum, tin, tungsten, vanadium, zinc, zirconium, and oxides thereof.

Typically, this method will include drawing a vacuum on the treatment chamber and introducing gases selected from the group consisting of inert gases, reactive gases, and combinations thereof. Likewise, it is preferable in this method to apply the thin-film coating to the surface of the wheel rim or motorcycle part until the thin-film coating reaches a thickness between 300-3000 Angstroms. The article produced in this embodiment will often comprise a wheel rim and the articles produced by the method are also within the invention.

Another embodiment of the invention is a method of forming a non-uniform thin-film dichroic coating on a wheel rim, comprising: cleaning a surface of the wheel rim by a treatment selected from the group consisting of acetone treatment, rouge (ferric oxide) treatment, ultrasonic treatment, and combinations thereof; positioning the wheel rim in a vacuum treatment chamber; drawing a vacuum in the vacuum treatment chamber to a pressure range between $1 \times 10^{-6}$ to $1 \times 10^{-1}$ Torr; and sputtering a thin-film coating using a target selected from the group consisting of silicon and titanium to the surface of the wheel to obtain a film thickness between 300-3000 Angstroms.

Variations of this embodiment include those wherein the sputtering is selected from the group consisting of bias sputtering and cathodic magnetron sputtering; those further comprising introducing argon gas at pressures in the range of 1 to 20 millitorr; those further comprising introducing reactive gases selected from the group consisting of oxygen, nitrogen, or cetalyne, and combinations thereof; those, further comprising the thin-film coating being selected from the group consisting essentially of doped silicon, undoped silicon, doped titanium, and undoped titanium, and wherein doping substances are selected from the group consisting of aluminum, boron, carbon, chromium, cobalt, copper, gold, iridium, iron, lead, magnesium, manganese, molybdenum, nickel, niobium, platinum, silver, tantalum, tin, tungsten, vanadium, zinc, zirconium, and oxides thereof; those further comprising controlling coating properties by varying the temperature of the surface of the wheel rim; those further comprising controlling coating properties by varying the voltage across the vacuum chamber in a range from 308-1008 volts; those further comprising controlling coating properties by varying pressure within the vacuum chamber; and those wherein the surface of the wheel rim is chrome. A thin-film coated wheel rim produced in accordance with this method is also part of the present invention.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the inventions which, is to be given the full breadth of the claims appended and any and all equivalents thereof.

What is claimed is:

1. A method of forming a thin-film coating on wheel rims or motorcycle parts, comprising
    preparing a surface of the wheel rim or motorcycle part;
    positioning the wheel rim or motorcycle part in a treatment chamber; and
    applying a non-uniform thin-film coating to the surface of the wheel rim or motorcycle part until the thin-film coating reaches a thickness between 300-3000 Angstroms, wherein the thin film coating is selected from the group consisting of silicon, doped silicon, titanium and doped titanium.

2. The method of claim 1, wherein the surface is pretreated with acetone.

3. The method of claim 1, wherein the surface is pretreated with rouge (ferric oxide).

4. The method of claim 1, wherein applying the thin-film coating is selected from the group consisting of sputtering, bias sputtering, cathodic magnetron sputtering, vapor deposition, plasma spray, chemical vapor deposition, thermal evaporation deposition, E Beam evaporation, and cathodic arc deposition.

5. The method of claim 1, wherein doping substances are selected from the group consisting of aluminum, boron, carbon, chromium, cobalt, copper, gold, iridium, iron, lead, magnesium, manganese, molybdenum, nickel, niobium, platinum, silver, tantalum, tin, tungsten, vanadium, zinc, zirconium, and oxides thereof.

6. The method of claim 1, further comprising drawing a vacuum on the treatment chamber and introducing gases selected from the group consisting of inert gases, reactive gases, and combinations thereof.

7. The method of claim 1, wherein the automotive wheel rim or motorcycle part comprises a chromed wheel rim.

8. A wheel rim or motorcycle part produced in accordance with the method of claim 1.

9. A method of forming a thin-film dichroic coating on a wheel rim, comprising
cleaning a surface of the wheel rim by a treatment selected from the group consisting of acetone treatment, rouge (ferric oxide) treatment, ultrasonic treatment, and combinations thereof;
positioning the wheel rim in a vacuum treatment chamber;
drawing a vacuum in the vacuum treatment chamber to a pressure range between $1\times106^{-6}$ to $1\times10^{-1}$ Torr; and
sputtering a non-uniform thin-film coating using a target selected from the group consisting of silicon, doped silicon, titanium and doped titanium to the surface of the wheel to obtain a film thickness between 300-3000 Angstroms.

10. The method of claim 9, wherein the sputtering is selected from the group consisting of bias sputtering and cathodic magnetron sputtering.

11. The method of claim 9, further comprising introducing argon gas at pressures in the range of 1 to 20 millitorr.

12. The method of claim 11, further comprising introducing reactive gases selected from the group consisting of oxygen, nitrogen, or cetalyne, and combinations thereof.

13. The method of claim 9,
wherein doping substances are selected from the group consisting of aluminum, boron, carbon, chromium, cobalt, copper, gold, iridium, iron, lead, magnesium, manganese, molybdenum, nickel, niobium, platinum, silver, tantalum, tin, tungsten, vanadium, zinc, zirconium, and oxides thereof.

14. The method of claim 9, further comprising controlling coating properties by varying the temperature of the surface of the wheel rim.

15. The method of claim 9, further comprising controlling coating properties by varying the voltage across the vacuum chamber in a range from 308-1008 volts.

16. The method of claim 9, further comprising controlling coating properties by varying pressure within the vacuum chamber.

17. The method of claim 9, wherein the surface of the wheel rim is chrome.

18. A thin-film coated wheel rim produced in accordance with the method of claim 9.

* * * * *